(12) United States Patent
Schulz

(10) Patent No.: US 6,674,644 B2
(45) Date of Patent: Jan. 6, 2004

(54) MODULE AND CONNECTOR HAVING MULTIPLE CONTACT ROWS

(75) Inventor: Jurgen Schulz, Pleasanton, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 10/044,055

(22) Filed: Nov. 1, 2001

(65) Prior Publication Data

US 2003/0081387 A1 May 1, 2003

(51) Int. Cl.[7] .................... H05K 1/14; H01R 23/70
(52) U.S. Cl. .............. 361/728; 361/730; 361/803; 361/807; 439/637
(58) Field of Search .................. 361/728, 729, 361/736, 803, 807; 439/637

(56) References Cited

U.S. PATENT DOCUMENTS

| 4,095,866 | A | | 6/1978 | Merrill |
| 4,656,605 | A | | 4/1987 | Clayton |
| 5,272,664 | A | | 12/1993 | Alexander et al. |
| 5,495,397 | A | * | 2/1996 | Davidson et al. ........... 361/784 |
| 5,504,700 | A | | 4/1996 | Insley et al. |
| 5,741,148 | A | | 4/1998 | Biernath |
| 5,947,753 | A | * | 9/1999 | Chapman et al. ............. 439/79 |
| 5,973,951 | A | | 10/1999 | Bechtolsheim et al. |
| 6,010,368 | A | * | 1/2000 | Tai .............................. 439/637 |
| 6,038,132 | A | | 3/2000 | Tokunaga et al. |
| 6,320,750 | B2 | * | 11/2001 | Shaler et al. ................ 361/736 |

FOREIGN PATENT DOCUMENTS

EP 0651470 3/1995

OTHER PUBLICATIONS

International Search Report application No. PCT/US02/34607 mailed May 27, 2003.

* cited by examiner

Primary Examiner—Jayprakash N. Gandhi
(74) Attorney, Agent, or Firm—Meyertons, Hood, Kivlin, Kowert & Goetzel, P.C.; Eric B. Meyertons

(57) ABSTRACT

A module and a corresponding connector that include multiple rows of contacts is described. In one embodiment, the module may include a channel formed in a bottom edge of the module. A plurality of contacts may be disposed on the inner surface of the channel and the outer surface of the module. A complementary connector is also described.

25 Claims, 4 Drawing Sheets

MODULE AND CONNECTOR HAVING MULTIPLE CONTACT ROWS

BACKGROUND OF THE INVENTION

1. Field of the Invention

The present invention generally relates to modules for computer system. More particularly to modules and connectors having an increased number of contacts.

2. Description of the Relevant Art

Many different types of modules are used to expand the capabilities of computer systems. Modules generally include a plurality of integrated circuits that are mounted to a support. The support generally includes a plurality of contacts (also known as contact pads or pins) that are electrically coupled to the integrated circuits. The module may be coupled to a computer processor (e.g., via a motherboard). The contacts provide an addressable electrical connection between the computer processor and the module. During use, the computer processor may accesses the integrated circuits mounted to the support via the contacts. A variety of modules having this general structure are known, including memory modules, sound cards, video cards, communication cards (e.g., modems, Ethernet cards, Firewire cards, etc.), and input/output device cards. The complexity of these modules may be limited due to the number of contacts that can be physically placed on the module while adhering to the space requirements inside a typical computer chassis. Complexity may be increased by the placement of more contacts on the module.

Generally speaking, modules may include a printed circuit board on which a plurality of integrated circuits (e.g., DRAMs in a memory module) may be surface mounted. A connective portion along one edge of the module may be configured for insertion into a complementary space of a connector. A plurality of contacts on the connective portion may mate with a plurality of corresponding contacts inside the complementary space of the connector to provide for the transfer of electrical signals between the module and the rest of the computer system.

On some modules, the connective portion may include a plurality of contacts on either the front side of the edge of the module or on both the front and back sides of the module. In some configurations that include contacts on both the front and back sides of a module, opposing contacts on the two sides may be shorted together. In other types of modules, the contacts may be positioned along the connective portion on both the front and back sides of the module. At least some of these opposing contacts on the two sides of the module may be configured to carry different electrical signals, thereby increasing the signal density without necessitating smaller contacts or a larger printed circuit board.

One problem with the current modules is that future technology may require more pin contacts. For example, with memory modules the current 168-pin DIMM and connector allows up to 168 pin contacts with 84 contacts per side in a length of around 5.2 inches. Additional contacts may currently be added to a module by increasing the pitch of the contacts. The "pitch" refers to the number of contacts per unit length of a connector edge. To increase the pitch, the size of the contacts is typically reduced. As more contacts are required, however, reducing the size of the contacts to add more contacts to a module may be expensive and impractical.

SUMMARY OF THE INVENTION

In one embodiment, a module and module connectors for use in computer systems having multiple rows of contacts is described. A module, in one embodiment, includes a supporting member and integrated circuits coupled to the supporting member. The supporting member includes a first end, a second end, and a bottom end. A channel is formed in the supporting member along the bottom edge of the supporting member and extending between the first end and the second end. A plurality of contacts, electrically coupled to the integrated circuits, are disposed along the bottom edge. A portion of the contacts are disposed on an outer surface of the module; and another portion of the contacts are disposed on an inner surface of the channel. Module connectors complementary to the above described connector are also described.

BRIEF DESCRIPTION OF THE DRAWINGS

Other objects and advantages of the invention will become apparent upon reading the following detailed description and upon reference to the accompanying drawings in which.

Figure 1:
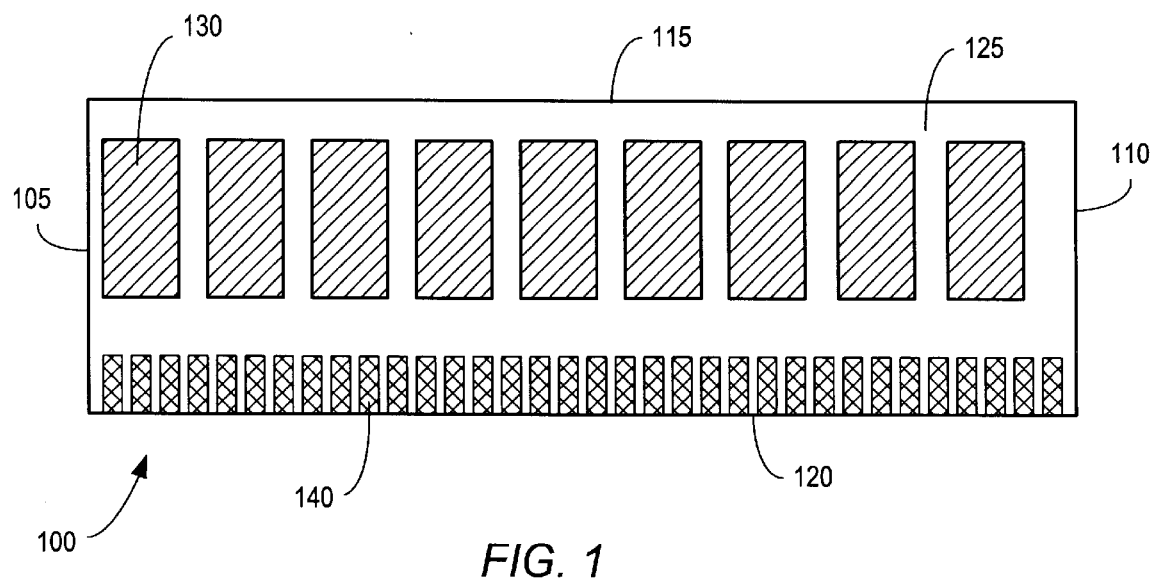
FIG. 1 depicts a front view of a module having a channel.

While the invention is susceptible to various modifications and alternative forms, specific embodiments thereof are shown by way of example in the drawings and will herein be described in detail. It should be understood, however, that the drawing and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF SEVERAL EMBODIMENTS

FIG. 1 depicts a front view of a module. In one embodiment, the module may include a first end 105, second end 110, top end 115, bottom end 120, first outer surface 125, and second outer surface (reverse—not shown). At least one integrated circuit 130 may be coupled to the first and/or second outer surfaces. As depicted in FIG. 1, a plurality of integrated circuits may be coupled to the first and/or second outer surfaces. In an embodiment, integrated circuits 130 may be memory integrated circuits (e.g., DRAM) to form a memory module. Other types of integrated circuits may also be coupled to the outer surfaces including integrated circuits for sound cards, video cards, communication cards, or input/output cards. Bottom end 120 may include a plurality of contacts 140. Contacts 140 may be electrically coupled to integrated circuits 130. Contacts 140 may be disposed on first outer surface 125 and/or the second outer surface 135 (See FIG. 2).

Figure 2:
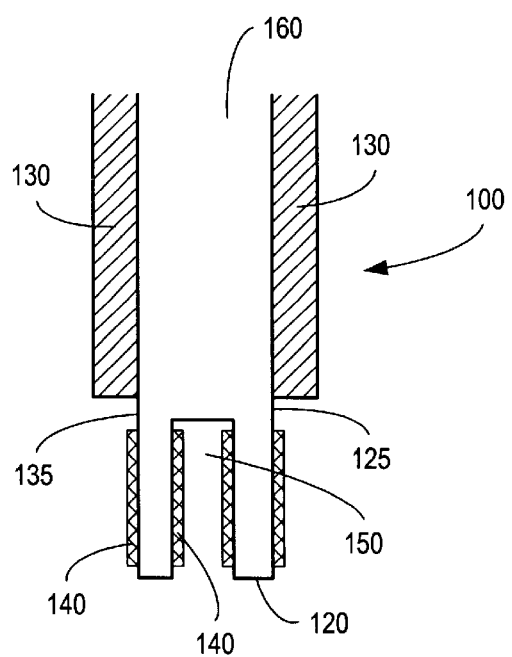
FIG. 2 depicts a cross-sectional side view of a module formed on a support member.

FIG. 2 depicts a cross-sectional view of the module depicted in FIG. 1, as viewed toward first end 125 of the module. As depicted in FIG. 2, bottom end 120 may include a channel 150 that extends along the bottom edge of the module from the first end 105 toward the second end 110 of the module. Contacts 140 may be disposed on the inner surface of channel 150. In the embodiment depicted in FIG. 2, contacts may be disposed along the inner surfaces of channel 150, the first outer surface 125, and the second outer surface 135.

In an embodiment, the integrated circuits and contacts may be disposed on a supporting member 160. Channel 150 may be defined by supporting member 160. Channel 150 may be cut into supporting member 160 during manufacture of the module. Alternatively, supporting member may be molded such that channel 150 is formed in supporting member 150 during the manufacture of the supporting member.

Figure 3:
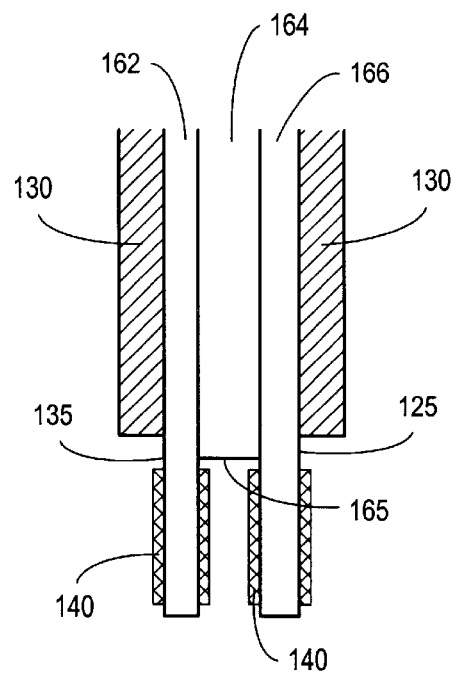
FIG. 3 depicts a cross-sectional side view of a module formed on a support member, where the support member includes a plurality of layers.

FIG. 3, depicts a cross-sectional view of an alternate embodiment of a module. The module of FIG. 3 has many of the same components as described above for FIGS. 1 and 2. The embodiment depicted in FIG. 3 differs from the above-described modules in that the support member is composed of multiple layers of material. In one embodiment, the support member may be composed of three layers, a first outer layer 162, a second outer layer 166 and an inner layer 164. Integrated circuits 130 and contacts 140 may be disposed on the surfaces of first and second outer layers, 162 and 164, respectively. Channel 150 may be defined by first outer layer 162, second outer layer 166, and inner layer 164. First outer layer 162 and second outer layer 166 may extend beyond a bottom surface 165 of inner layer 164 to form channel 150. Contacts 140 may be disposed on the inner surface of channel 150 and the outer surfaces of the first and second outer layers.

Supporting member 160 and layers 162, 164, and 166 may be formed of any typical materials known in the art for producing printed wire boards. Such materials may include epoxy resins, for example. Supporting member 160 may also be formed of alternating layers of prepeg material and core materials. For example, as depicted in FIG. 3, outer layers 162 and 166 may be formed of a core material, while inner layer 164 may be formed from a prepeg material.

Modules having the structures described above may include more contacts than prior art modules. The number of contacts may be increased in this manner without increasing the pin pitch to accommodate more connections or decreasing the size of the contacts. In some embodiments, the number of contacts may be doubled with respect to the number of contacts in prior art modules having the same length, same pitch and same size contacts.

Figure 4:
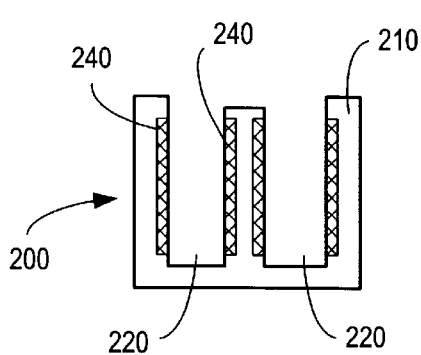
FIG. 4 depicts a cross sectional view of a connector.

In one embodiment, a module as described herein may be mounted to a computer system via a connector. A cross-sectional view of a connector 200 configured to receive a module as described herein is depicted in FIG. 4. Connector 200 may include a housing 210 and two or more channels 220, complementary in size and shape with the bottom edge of a module, disposed within the housing. Channels 220 extend from a first end of the housing to a second end of the housing along a longitudinal axis of the housing. A plurality of connector contacts 240 may be disposed on an inner surface of channels 220. The number of connector contacts may be equal to the number of contacts disposed on a module. The contacts may also have a substantially identical pitch as the pitch of the contacts disposed on a module.

Figure 5:
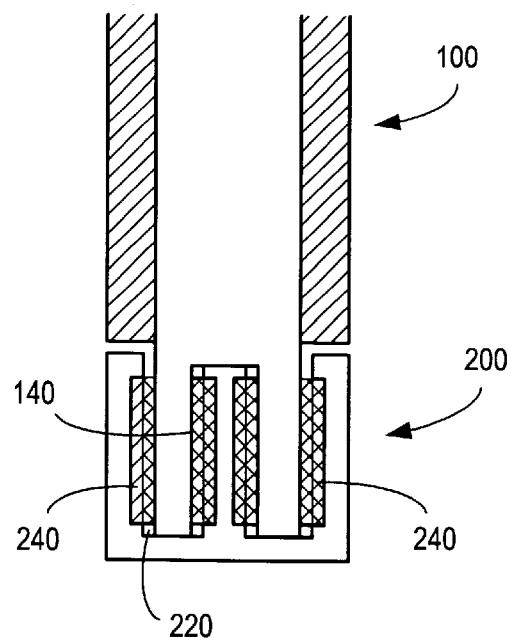
FIG. 5 depicts a cross-sectional view of a module mated with a complementary connector.

During use a module 100 may be inserted into connector 200 as depicted in FIG. 5. In one embodiment, the plurality of contacts 240 are disposed within connector channels 220 so as to be vertically opposed to each other. When a portion of module 100 is inserted into channels 220, the module 100 may be weakly held between the contacts 240, as depicted. As the module 100 is pushed down to an implementation position, the module may elastically deform the connector contacts 240 so that contacts 140 of module 200 and connector contacts 240 are brought into contact with each other. In this manner an interference fit may be achieved between the connector and the module.

Figure 6:
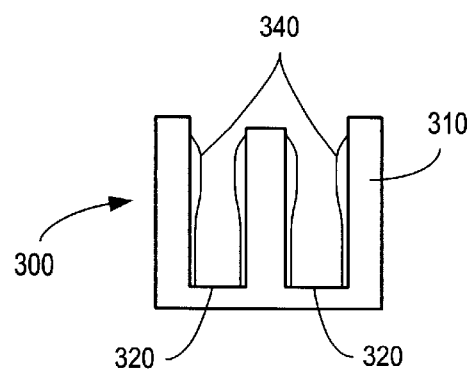
FIG. 6 depicts a cross sectional view of a connector having locking clips.

In another embodiment, a module as described herein may be mounted to a computer system via a connector 300. A cross-sectional view of a connector 300 configured to receive a module as described herein is depicted in FIG. 6. Connector 300 may include a housing 310 and two or more channels 320, complementary in size and shape with the bottom edge of a module, disposed within the body. A plurality of flexible clips 340 may be disposed on an inner surface of channels 320. In this embodiment, the flexible clips may be the "contacts" between the connector and the module. The number of flexible clips may be equal to the number of contacts disposed on a module. The flexible clips may also have a substantially identical pitch as the pitch of the contacts disposed on a module.

Figure 7:
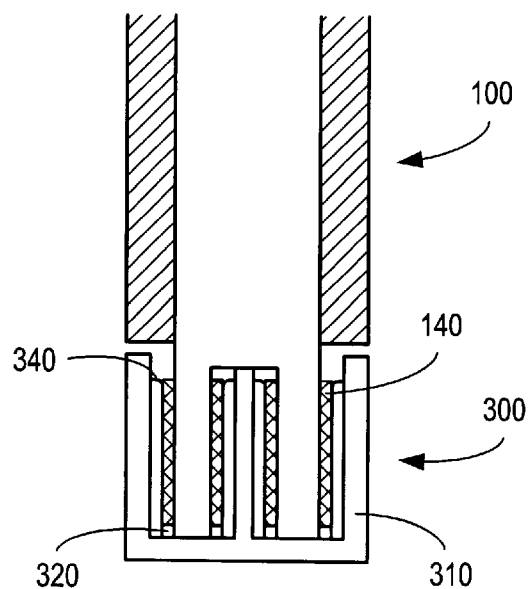
FIG. 7 depicts a cross sectional view of a connector with locking clips mating with a module.

During use a module 100 may be inserted into connector 300 as depicted in FIG. 7. When a portion of module 100 is inserted into channels 320, the module 100 may cause flexible clips 340 to be deformed as depicted in FIG. 7. The deformed flexible clips 340 may provide a force against a module that secures the module within connector housing 310. Contact of flexible clips 340 with contacts 140 of a module may also provide an electrical connection between the module and the connector.

Figure 8:
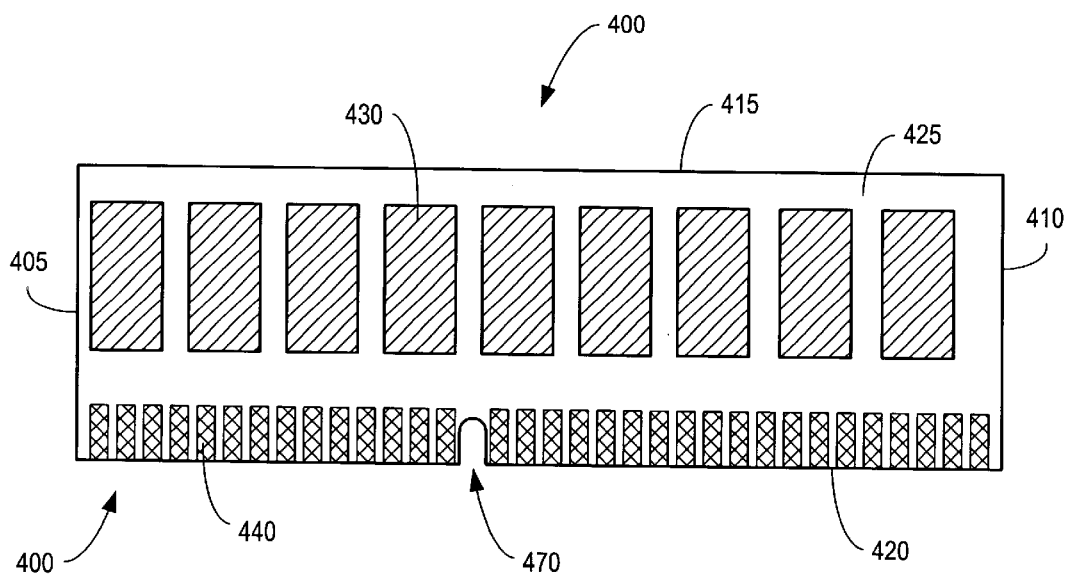
FIG. 8 depicts a module that includes notches.

Turning to FIG. 8, an embodiment of a module 400 is depicted that includes at least one notch 470 for improved insertion into a complementary connector. In one embodiment, the module may include a first end 405, second end 410, top end 415, bottom end 420, first outer surface 425, and second outer surface (reverse—not shown). At least one integrated circuit 430 may be coupled to the first and/or second outer surfaces. As depicted in FIG. 8, a plurality of integrated circuits may be coupled to the first and/or second outer surfaces. Bottom end 420 may include a plurality of contacts 440. Bottom end 420 may include a channel (not depicted) that extends along the bottom edge of the module from the first end 405 toward the second end 410 of the module as described in previous embodiments.

Module 400 includes a notch 470 positioned along bottom end 420 of module 400. Notch 470 may be positioned at a point along bottom end 420 that is not at the center of bottom end 420. The notch, therefore, divides the contacts into two unsymmetrical groups. A first group of contacts is positioned between first end 405 and the notch 470. A second group of contacts are positioned between notch 470 and second end 410. The number of contacts in one group maybe different from the number of contacts in a second group. A connector may include a key positioned at a point that is complementary to the position of notch 470 on module 400. When placed in a connector the notch aligns with the key when the module is placed in a connector in the correct orientation. If the module is not in the correct orientation, the notch will not mate with the key. A person installing the module will be unable to properly insert the module into the connector until the orientation is corrected. The use of a notch in this manner reduces the chance of a module being improperly installed. It should be understood that while only one notch is shown, a plurality of notches may be disposed in an unsymmetrical manner to achieve the same effect.

Figure 9:
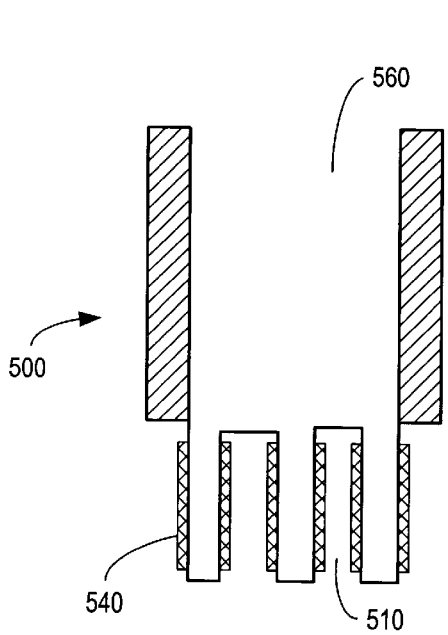
FIG. 9 depicts a module having a plurality of channels.

FIG. 9 depicts a cross-sectional view of a module 500, as viewed toward a first end of the module. Module 500 may have two or more channels 510 that run from the first end of the module toward the second end of the module. Contacts 540 may be disposed on the inner surface of channels 510. In the embodiment depicted in FIG. 2, contacts may be disposed along the inner surfaces of channels 510, and also on the outer surfaces of the module, as depicted in FIG. 9.

In an embodiment, the integrated circuits and contacts may be disposed on a supporting member 560. Channel 510 may be defined by supporting member 560. Channels 510 may be cut into a supporting member 560 during manufacture of the module. Alternatively, supporting member 560 may be molded such that channels 510 are formed in supporting member 560 during the manufacture of the supporting member.

Figure 10:
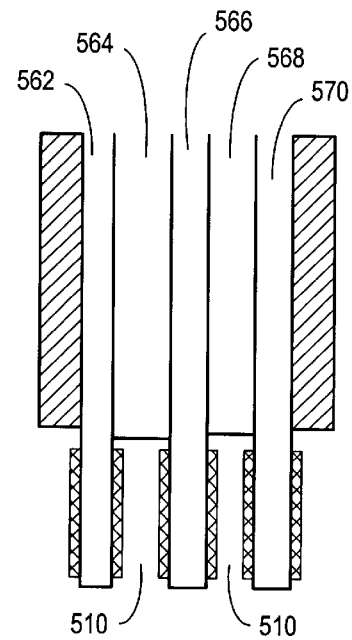
FIG. 10 depicts a module having a plurality of channels, where the module is formed from a plurality of layers.

FIG. 10 depicts a cross-sectional view of an alternate embodiment of a module. The module of FIG. 10 has many of the same components as described above for FIGS. 1 and 2. The embodiment depicted in FIG. 10 differs from the above-described modules in that the support member is composed of multiple layers of material. In one embodiment, the support member may be composed of multiple layers. As depicted in FIG. 10, the module includes, a first outer layer 562, a second outer layer 570, a central layer 566, a first inner layer 564 and a second inner layer 568. Channels 510 may be defined by the combination of the outer layers and the inner layers. First outer layer 562, second outer layer 570, and central layer 566 may extend beyond a bottom surface of some of the inner layers to form channels 510. Contacts 540 may be disposed on the inner surface of channels 510 and the outer surfaces of the first and second outer layers.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A module, comprising:
   a supporting member, the supporting member comprising a first end, a second end, and a bottom end;
   integrated circuits coupled to the supporting member;
   a channel formed in the supporting member along the bottom edge of the supporting member and extending between the first end and the second end;
   a plurality of contacts electrically coupled to the integrated circuits, wherein a portion of the contacts are disposed on an outer surface of the module; and wherein a portion of the contacts are disposed on an inner surface of the channel.

2. The module of claim 1, wherein the integrated circuits comprise memory integrated circuits.

3. The module of claim 1, further comprising one or more notches dividing the contacts into at least two groups of contacts, wherein the notch is positioned to divide the contacts into groups having a dissimilar number of contacts.

4. The module of claim 1, wherein the contacts disposed on the inner surface of the channel are disposed on opposing surfaces of the channel.

5. The module of claim 1, wherein the contacts are disposed on the supporting member in at least four rows, a first row disposed on a first outer surface of the supporting member, a second row disposed on a second outer surface of the supporting member, a third row disposed on a first inner surface of the channel, and a fourth row disposed on a second inner surface of the channel.

6. The module of claim 5, wherein the first, second, third and fourth rows have substantially the same number of contacts.

7. The module of claim 1, wherein the supporting member comprises a plurality of layers.

8. The module of claim 1, wherein the supporting member comprises a first outer layer, a second outer layer, and an inner layer positioned between the first and second outer layers.

9. The module of claim 8, wherein the outer layer comprise a material that is different from the material of the inner layer.

10. The module of claim 8, wherein the first and second outer layer extend beyond a bottom edge of the inner layer to define the channel.

11. A computer system comprising a module coupled to a connector;
   the module, comprising:
      a supporting member, the supporting member comprising a first end, a second end, and a bottom end;
      integrated circuits coupled to the supporting member;
      a module channel formed in the supporting member along the bottom edge of the supporting member and extending between the first end and the second end;
      a plurality of contacts electrically coupled to the integrated circuits, wherein a portion of the contacts are disposed on an outer surface of the module; and wherein a portion of the contacts are disposed on an inner surface of the channel;
   the connector comprising:
      a housing comprising a first end and a second end;
      at least two connector channels formed in the housing, the channels extending from the first end to the second end;
      a plurality of contacts disposed on inner surfaces of the channels.

12. The computer system of claim 11, wherein the integrated circuits comprise memory integrated circuits.

13. The computer system of claim 11, further comprising one or more notches dividing the contacts into at least two groups of contacts, wherein the notch is positioned to divide the contacts into groups having a dissimilar number of contacts.

14. The computer system of claim 11, wherein the contacts disposed on the inner surface of the module channel are disposed on opposing surfaces of the module channel.

15. The computer system of claim 11, wherein the contacts are disposed on the supporting member in at least four rows, a first row disposed on a first outer surface of the supporting member, a second row disposed on a second outer surface of the supporting member, a third row disposed on a first inner surface of the module channel, and a fourth row disposed on a second inner surface of the module channel.

16. The computer system of claim 11, wherein the first, second, third and fourth rows have substantially the same number of contacts.

17. The computer system of claim 11, wherein the supporting member comprises a plurality of layers.

18. The computer system of claim 11, wherein the supporting member comprises a first outer layer, a second outer layer, and an inner layer positioned between the first and second outer layers.

19. The computer system of claim 18, wherein the outer layers comprise a material that is different from the material of the inner layer.

20. The computer system of claim 18, wherein the first and second outer layer extend beyond a bottom edge of the inner layer to define the module channel.

21. The computer system of claim 11, further comprising one or more keys disposed within the connector channel, wherein the keys are configured to mate with a notch on the module during use such that the module is positioned within the connector in the proper orientation.

22. The computer system of claim 11, wherein the connector channels formed in the connector are complementary to the bottom edge of the module.

23. The computer system of claim 11, wherein the contacts are disposed in the connector channels in at least four rows, a first row disposed on a first inner surface of the first connector channel, a second row disposed on a second inner surface of the first connector channel, a third row disposed on a first inner surface of the second connector channel, and a fourth row disposed on a second inner surface of the second connector channel.

24. The computer system of claim 23, wherein the first, second, third and fourth rows have substantially the same number of contacts.

25. The computer system of claim 11, wherein the contacts comprise flexible clips.

* * * * *